(12) United States Patent
Wang et al.

(10) Patent No.: US 8,444,044 B2
(45) Date of Patent: May 21, 2013

(54) APPARATUS AND METHODS FOR FORMING WIRE BONDS

(75) Inventors: Low Peng Wang, Singapore (SG); Mitchell Ong, Singapore (SG); Lee Choon Kuan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 1393 days.

(21) Appl. No.: 12/062,989

(22) Filed: Apr. 4, 2008

(65) Prior Publication Data

US 2009/0223937 A1    Sep. 10, 2009

(30) Foreign Application Priority Data

Mar. 10, 2008 (SG) ................. 200801938-2

(51) Int. Cl.
*B23K 31/02* (2006.01)
*B23K 37/00* (2006.01)

(52) U.S. Cl.
USPC ........................................ 228/180.5; 228/4.5

(58) Field of Classification Search
None
See application file for complete search history.

(56) References Cited

U.S. PATENT DOCUMENTS

| | | | |
|---|---|---|---|
| 4,170,326 A | 10/1979 | Wright | |
| 4,845,354 A * | 7/1989 | Gupta et al. | 250/205 |
| 4,893,742 A * | 1/1990 | Bullock | 228/111.5 |
| 4,915,565 A | 4/1990 | Bond et al. | |
| 5,305,944 A | 4/1994 | Yoshida et al. | |
| 5,346,857 A | 9/1994 | Scharr et al. | |
| 5,364,011 A | 11/1994 | Baker et al. | |
| 5,452,841 A * | 9/1995 | Sibata et al. | 228/180.5 |
| 5,565,119 A * | 10/1996 | Behun et al. | 219/121.63 |
| 5,614,113 A * | 3/1997 | Hwang et al. | 219/121.64 |
| 5,869,354 A | 2/1999 | Leedy | |
| 5,938,952 A * | 8/1999 | Lin et al. | 219/121.64 |
| 5,948,286 A * | 9/1999 | Chalco et al. | 219/121.63 |
| 6,041,994 A | 3/2000 | Hwang et al. | |
| 6,234,374 B1 | 5/2001 | Hwang et al. | |
| 6,384,366 B1 | 5/2002 | Wong | |
| 6,472,758 B1 | 10/2002 | Glenn et al. | |
| 6,640,423 B1 | 11/2003 | Johnson et al. | |
| 6,696,669 B2 | 2/2004 | Hembree et al. | |
| 6,892,927 B2 | 5/2005 | Rumer et al. | |
| 7,975,901 B2 * | 7/2011 | Maeda et al. | 228/180.5 |
| 2001/0016062 A1 | 8/2001 | Enokido et al. | |
| 2001/0042777 A1 * | 11/2001 | Kyomasu et al. | 228/180.5 |

(Continued)

FOREIGN PATENT DOCUMENTS

DE    4337513 A  *  5/1995
GB    2244374       11/1991

(Continued)

OTHER PUBLICATIONS

DERWENT-ACC-No. 1990-219435 which corresponds to JP-02-143438A (1990).*

(Continued)

*Primary Examiner* — Kiley Stoner
(74) *Attorney, Agent, or Firm* — TraskBritt (57) ABSTRACT

A wire bonding apparatus includes a processing block, a bond head assembly and an infrared radiation source for selectively heating the bond pad areas of one or more semiconductor dies and/or bonding sites on a substrate. Methods for forming wire bonds using selective heating of the bond pad areas of one or more semiconductor dies and/or bonding sites on the substrate are also disclosed.

24 Claims, 4 Drawing Sheets

U.S. PATENT DOCUMENTS

| | | | |
|---|---|---|---|
| 2003/0127434 A1* | 7/2003 | Ruben | 219/121.64 |
| 2004/0200885 A1 | 10/2004 | Derderian | |
| 2005/0150932 A1* | 7/2005 | Hosseini | 228/180.5 |
| 2005/0184133 A1* | 8/2005 | Clauberg et al. | 228/203 |
| 2006/0099735 A1 | 5/2006 | Chou | |
| 2007/0048904 A1 | 3/2007 | Frutschy | |

FOREIGN PATENT DOCUMENTS

| | | | |
|---|---|---|---|
| JP | 55065443 | | 5/1980 |
| JP | 61168233 | | 7/1986 |
| JP | 62-018725 A | * | 1/1987 |
| JP | 62-210633 A | * | 9/1987 |
| JP | 02096394 | | 4/1990 |
| JP | 02310939 | | 12/1990 |
| JP | 4-106942 A | | 4/1992 |
| JP | 04151844 | | 5/1992 |
| JP | 05109811 | | 4/1993 |
| JP | 05-152369 A | * | 6/1993 |
| JP | 05243722 | | 9/1993 |
| JP | 05335377 | | 12/1993 |
| WO | 01/97278 A1 | | 12/2001 |

OTHER PUBLICATIONS

Search Report and Written Opinion of the Hungarian Intellectual Property Office to the Intellectual Property Office of Singapore, Singapore Application No. 200801938-2, mailed Feb. 16, 2012, 12 pages.

* cited by examiner

APPARATUS AND METHODS FOR FORMING WIRE BONDS

TECHNICAL FIELD

The present invention relates generally to the processing of semiconductor devices. More particularly, embodiments of the present invention relate to methods and apparatus for forming wire bonds.

BACKGROUND

Figure 1:
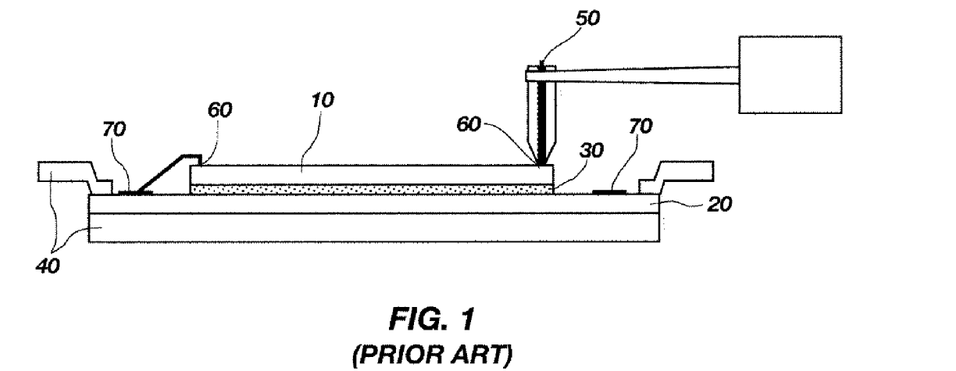
FIG. 1 shows a side view of a conventional apparatus for forming wire bonds.

In processing semiconductor devices in the microelectronics industry, wire bonding is a widely used, well-established method of chip interconnection with external circuitry. FIG. 1 shows a side view of a conventional apparatus for forming wire bonds. In a conventional wire bonding process used with interposer or other carrier substrates, the back side, or non-active side, of a semiconductor die or chip 10, such terms being used interchangeably in the industry, is firmly attached to a suitable substrate or package bottom 20. The chip 10 is conventionally bonded to the substrate 20 using either an organic adhesive, a glass, or a metal-alloy reflow process generally shown as adhesive layer 30. Additional chips 10 may be subsequently attached on top of the first chip 10 using additional adhesive layers 30 between each chip 10 of the resulting chip stack. The chip 10 and substrate 20 are positioned on a processing block 40 of a wire bonding apparatus in contact with either the die back for a board-on-chip (BOC) confirmation or the substrate for a chip-on-board (COB) configuration. A wire bonding operation is then carried out, wherein conductive wires 50 are extended between and fused at each end thereof to bond pads 60 on chip 10 and to bonding sites 70 on the surface of the substrate 20 by a wire bonding capillary, typically using thermocompression bonding, ultrasonic bonding, or a combination of ultrasonic and heat in combination with compression, sometimes referred to as "thermosonic bonding."

In order to raise the temperature of the bond pads 60 and bonding sites 70 to an operating temperature wherein wire bonding may be rapidly and reliably affected, the processing block 40 is conventionally heated. In such a configuration, processing block 40 is typically known as a "heater" block, which conductively heats all of the substrate 20 and the chip 10, including the bonding pads 60 and bonding sites 70. The wire bonding operating temperature varies depending on the specific application. For example, the wire bonding operating temperature for thin small-outline packages (TSOPs) may be generally between 200° C. and 230° C., while for fine ball grid array (FBGA) packages the wire bonding operating temperature may generally be about 150° C.

Heating the chip to the elevated temperatures necessary to adequately heat the bonding pads may potentially damage the chip by overheating. Indeed, the elevated temperatures introduce thermo-mechanical stress on the active die surface and the integrated circuitry thereof. With the continuous reduction in size and thickness of semiconductor chips in order to meet packaging requirements, adverse effects of these thermo-mechanical stresses are significantly increased when such a relatively fragile chip is heated. Moreover, when chips are stacked one on top of another, as in a stacked, multi-chip package (MCP), the ambient temperature at the top chip layer is significantly lower than the ambient temperature at the lower layer or layers when the sole preheating source is the processing block, due to the thermal gradient of the chip stack. Thus, semiconductor chips in the lower layer or layers must be subjected to undesirably high temperatures in order for the bond pads in a higher layer or layers of chips to reach the required wire bonding operating temperatures. The increased temperature in the lower layer or layers introduces even more thermo-mechanical stresses in those lower layers.

Furthermore, the material used in adhesive layer 30 to attach one or more chips 10 to the substrate 20 may in some instances have voids, or air pockets, when it is applied. This is the case with so-called "skip cure" adhesives, which are also termed "b-stage" adhesives and are desirably not fully cured until the chip package is encapsulated, as in a transfer molding process. Such voids may generally be driven out during encapsulation of the semiconductor chip or chips and at least a portion of the substrate 20 when such an adhesive material between a chip and the substrate or between two stacked chips is subjected to the high molding pressures common to such transfer molding processes. However, if such an adhesive material is exposed to excessively high temperatures for an extended duration, or repeatedly, prior to encapsulation, premature cross-linking of the adhesive material takes place, which permanently traps the voids. The trapped voids may cause the device to later fail, exhibiting the so-called "popcorn" effect wherein the gas trapped in the voids expands and compromises the encapsulant envelope. In addition, repeated heating for wire-bonding a multi-chip stack may cause the adhesive material and substrate to outgas contaminants onto the in-process package, which may adversely affect downstream assembly processes Some approaches have been developed to heat the bond pads and bonding sites in addition to, or as an alternative to, using a heater block. Several of these approaches use a flood-type infrared radiation source to heat the semiconductor die and the substrate from above instead of from below. However, shining such an infrared radiation onto the entire top surface or even a substantial portion of the top surface of the semiconductor die still undesirably subjects a substantial portion, if not the entire die, to heating. Such generalized application of heat subjects the active die surface and the integrated circuitry thereof to the same undesirable heat-induced thermo-mechanical stresses that are caused by heating from the bottom using a heater block and may, as with the prolonged or repeated use of a heater block, prematurely cross-link the die-attach adhesive material and cause undesirable outgassing from the adhesive material and the substrate.

In other approaches, a laser is used to heat a single bond pad from above. However, using a single laser requires that each bond pad be heated and immediately bonded. Such a process requires a multiplicity of steps including turning on the laser, heating the bond pad, turning the laser off, bonding the wire, moving the laser to a subsequent bond pad, turning the laser on, heating the bond pad, turning the laser off, bonding the wire, etc. Such a method of heating the pad then bonding, heating the next pad then bonding, etc., requires many steps and may slow down the wire bonding method. In addition, if the laser is mispositioned just a little from the target bond pad, the laser may radiate the semiconductor die, causing damage to the integrated circuitry in the semiconductor die from the intense heat emitted by the laser.

To enable the manufacturing of wire-bonded semiconductor devices without subjecting these devices to potentially damaging heat while also protecting the adhesive used to attach the chip to the substrate from premature cross-linking, it would be desirable to develop a wire bonding method and apparatus for effectively limiting areas heated on a chip to substantially those areas including the bond pads and without subjecting an entire chip to substantial and repeated heating.

DETAILED DESCRIPTION

The illustrations presented herein are, in some instances, not actual views of any particular wire bonding apparatus, but are merely idealized representations which are employed to describe the present invention. Additionally, elements common between figures may retain the same numerical designation.

Embodiments of the present invention comprise apparatus for forming wire bonds on a semiconductor die assembly using infrared radiation to heat a region comprising one or more bond pads to the proper temperature without significantly heating the rest of the semiconductor die. Further embodiments of the present invention comprise methods of forming wire bonds on a semiconductor die assembly.

Figure 2A:
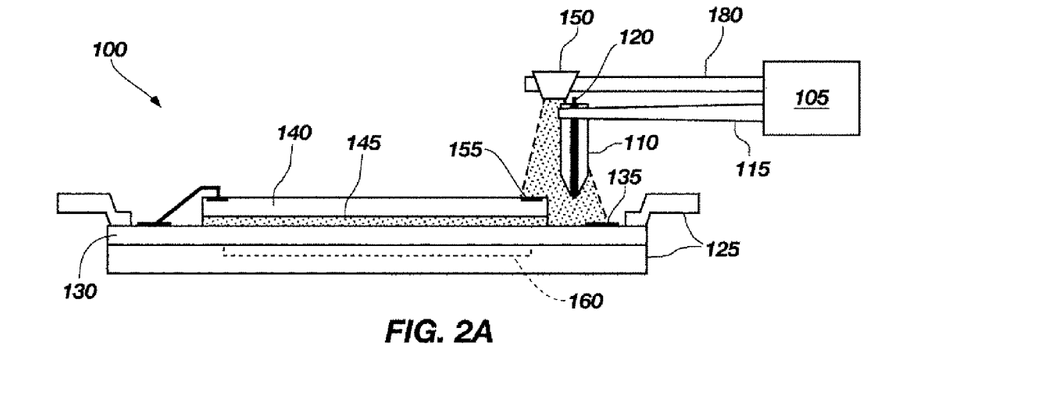
FIG. 2A shows a side view of a wire bonding apparatus according to an embodiment of the present invention illustrating an infrared radiation source heating a bond pad on a semiconductor die.
Figure 2B:
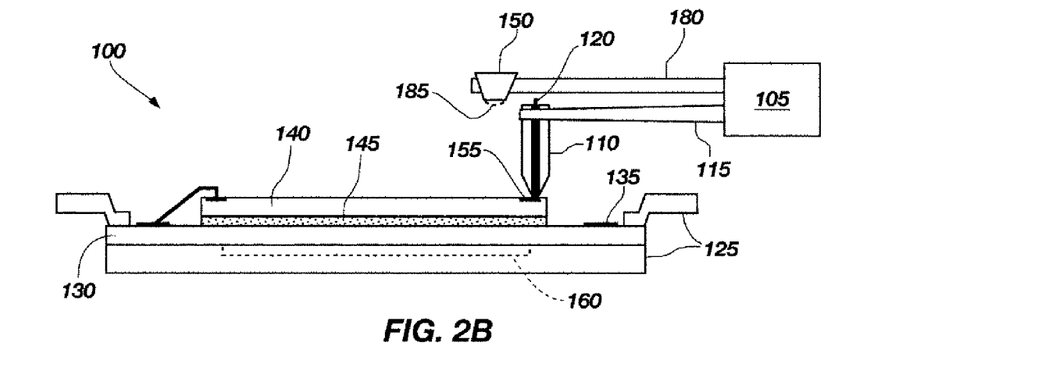
FIG. 2B shows a side view of the wire bonding apparatus of FIG. 2A illustrating a wire being bonded to the bond pad on the surface of a semiconductor die.
Figure 2C:
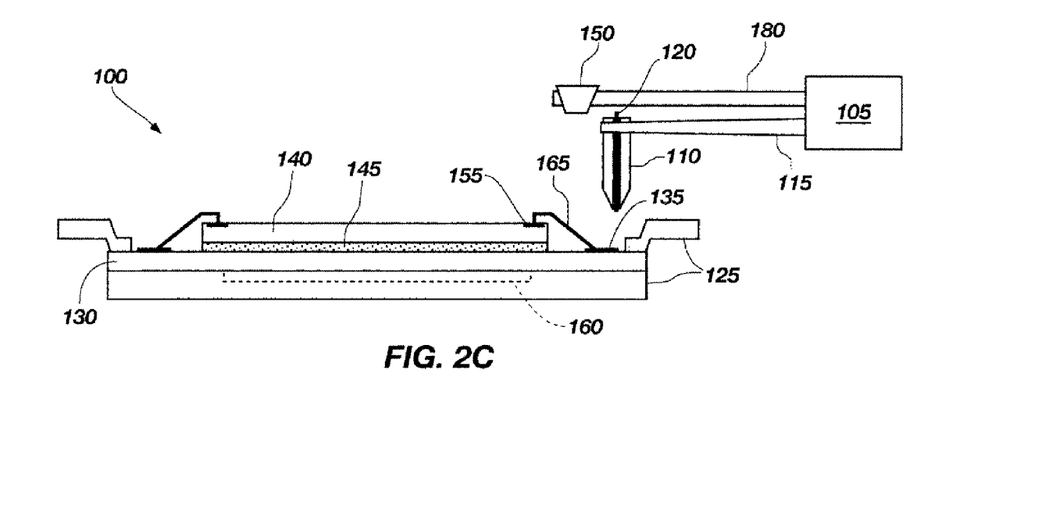
FIG. 2C shows a side view of a wire bonding apparatus of FIG. 2A illustrating a wire bond formed between the bond pad and a bonding site on a surface of a substrate.

FIGS. 2A-2C show a side view of a wire bonding apparatus 1 according to an embodiment of the present invention. The wire bonding apparatus 100 comprises a conventional wire bonding apparatus, such as a thermocompression bonder, an ultrasonic bonder, or thermosonic bonder. The wire bonding apparatus 100 includes a bond head assembly 105 including a computerized, video-enabled system for operably controlling and positioning a capillary 110, such components being conventional and commercially available. For an ultrasonic or thermosonic wire bonding apparatus 100, a transducer 115 may be coupled to the capillary 110 for stimulating ultrasonic vibrations in the capillary 110 during a bonding operation. The capillary 110 is configured to form a wire bond with a wire 120 passing through its middle.

The wire bonding apparatus 100 further includes a processing block 125 on which a substrate 130 may be positioned and secured for receiving a wire bond onto bonding sites 135. The substrate 130, as depicted, includes a semiconductor die 140 attached thereto. The semiconductor die 140 may be attached to the substrate 130 with an adhesive 145 positioned between the semiconductor die 140 and the substrate 130. By way of example and not limitation, the semiconductor die 140 may be attached to the substrate 130 using a "skip cure" die attach film (DAF) adhesive, a liquid epoxy adhesive, or an adhesive that is spin-coated onto a wafer backside (non-active side) from which semiconductor die 140 is subsequently singulated.

An infrared radiation source 150 may be associated with the wire bonding apparatus 100, the infrared radiation source 150 being configured to emit infrared radiation substantially on a region of the semiconductor die 140 and/or a region of the substrate 130. In some embodiments, the region on which the infrared radiation is emitted may comprise two or more bond pads 155 positioned on or in a surface of the semiconductor die 140. In other embodiments, the region on which the infrared radiation is emitted may comprise at least one bond pad 155 and at least one bonding site 135 on substrate 130. The infrared radiation may be emitted onto the region by focusing the infrared radiation from the infrared radiation source 150 onto the region of the semiconductor die and/or the substrate.

In some embodiments of the invention, the infrared radiation source 150 may be operably coupled and mounted to the bond head assembly 105. In such an embodiment, the bond head assembly 105 may be configured to position the infrared radiation source 150 over the substrate 130 and/or the semiconductor die 140 in order to direct the infrared radiation substantially onto the region comprising at least one bond pad 155 and/or bonding site 135. In some embodiments, the infrared radiation source 150 may be coupled to the bond head assembly 105 such that the infrared radiation source 150 moves with the capillary 110. In another embodiment, the infrared radiation source 150 may be operably coupled to the bond head assembly 105 such that the infrared radiation source 150 may move separate and independently from the capillary 110. Such an embodiment may enable the infrared radiation source 150 to heat the bond pads 155 and bonding sites 135 in advance of movement of the capillary 110 to the same locations. In other words, the capillary 110 may follow the infrared radiation source 150 and form wire bonds on those bond pads 155 and bonding sites 135 that have recently been heated, while the infrared radiation source 150 is simultaneously heating the next bond pads 155 and/or bonding sites 135.

The infrared radiation source 150 may comprise an infrared light or bulb heater capable of heating the region comprising at least one bond pad 155 or bonding site 135. The intensity and wavelength of the infrared radiation source 150 are selected depending upon the application. The intensity may be such that the desired wire bond operating temperature is achieved. A suitable wavelength or wavelength range of the infrared radiation may be determined by the materials to be heated, since some infrared wavelengths are not absorbed by some materials. One non-limiting example of a suitable commercially available infrared radiation source is a NUTONE® model 9417DN Bulb Heater by NuTone, Inc. of Cincinnati, Ohio. Such a commercially available infrared radiation source may be customized to be fitted or mounted to the bond head assembly 105 for embodiments such as that shown in FIGS. 2A-2C. Customizing and mounting the infrared radiation source 150 to the bond head assembly 105 may include attaching the infrared radiation source 150 to a mounting arm 180, and attaching the mounting arm 180 to the bond head assembly 105. The bond head assembly 105 may be programmed and configured to position the infrared radiation source 150 in a manner similar to the way in which a conventional bond head assembly 105 positions the capillary 110. In another embodiment, infrared radiation source 150 may comprise an optical fiber carried by bond head assembly 105 adjacent capillary 110, the optical fiber being operably coupled to a remote infrared radiation generator, the radiation being transmitted to the distal tip of the optical fiber and optionally focused using a lens or lenses to a bond pad-sized or other small area at the intended focal point. Although the embodiments illustrated in FIGS. 2A-2C show the infrared radiation source 150 as mounted to the bond head assembly 105, other embodiments may be employed in which the infrared radiation source 150 is not mounted to the bond head assembly 105, as will be discussed in greater detail below.

The infrared radiation source 150 may be configured to focus the infrared radiation onto the region comprising at least one bond pad 155 and/or bonding site 135. By way of example and not limitation, the infrared radiation may be focused to cover a region comprising more than one bond pad 155 and/or bonding site 135. In some embodiments, the region comprising the bond pads 155 and/or bonding sites 135 may comprise an area less than 15 square millimeters. Some embodiments may focus the infrared radiation to a region comprising an area between 10 square millimeters and 2 square millimeters, depending on the size of the semiconductor die 140. The infrared radiation source 150 may include a lens 185 (FIGS. 2B and 3B) for focusing the infrared radiation to the region comprising at least one bond pad 155 or bonding site 135. In one embodiment, the infrared radiation may be focused on a region comprising an area including half the total number of bond pads 155 and/or bonding sites 135 on one side of the semiconductor die 140 and/or substrate 130, the infrared radiation being specifically located so as to not emit substantial amounts of radiation to the remaining portions of the semiconductor die 140. By heating a group of bond pads 155 and/or bonding sites 135 together, the wire bonds may be formed on each of the bond pads 155 and bonding sites 135 such that the capillary 10 is not required to wait for a subsequent bond pad or bonding site to be heated between forming bonds. In other words, a group of bond pads 155 and/or bonding sites 135 may be heated simultaneously and the wire bonds may be formed between the entire group instead of heating a pad/site, then bonding, then heating another pad/site and bonding, etc.

As discussed above, the processing block 125 comprises a surface for receiving and supporting the substrate 130. In some embodiments of the invention, the processing block 125 may comprise a heated processing block 125, as noted above such a configuration being referred to as a "heater block." The heated processing block 125 provides some heat to the bond pads 155 and bonding sites 135 to help to bring them to a proper wire bond operating temperature. In order to protect the substrate 130, the semiconductor die 140 and the adhesive 145 from being exposed to excessive and unnecessary heat, the processing block 125 may be configured such that the processing block 125 conductively heats only those regions that are directly below the general areas of the bond pads 155, as illustrated in the embodiments of FIGS. 2A-2C. Some of these embodiments may include a layer of insulating material 160 positioned between the heated processing block 125 and the substrate 130 so that the heated processing block 125 conductively heats the semiconductor die 140 substantially only in the regions directly below the bond pads 155. In other words, the layer of insulating material 160 may be positioned below an area of the semiconductor die 140 which is laterally offset from the bond pads to insulate the semiconductor die 140 from conductive heat transfer generally in those areas. In the non-limiting embodiment illustrated in FIGS. 2A-2C, the bond pads 155 are located at the peripheral edge of the semiconductor die 140. Therefore, the layer of insulating material 160 may be aligned below an area of the semiconductor die 140 that is interior to the bond pads 155. Such a configuration may protect the rest of the semiconductor die 140 and the adhesive 145 from the negative effects (e.g., thermo-mechanical stresses, premature cross-linking) of being exposed to excessive heat from the processing block 125. The layer of insulating material 160 may comprise an insulating material capable of withstanding temperatures of at least 250° C. and of sufficient thickness to protect the desired area of semiconductor die 140. By way of example and not limitation, the layer of insulating material 160 may comprise a heat resistant plastic or polytetrafluoroethylene (PTFE). Such an embodiment is particularly suitable for wire bonding a single semiconductor die 140 to a substrate 130, as heat from the uninsulated areas of processing block 125 is easily transferred to bond pads 155 through the material of semiconductor die 140.

In one embodiment, a semiconductor die 140 may be positioned on and attached to the substrate 130 using adhesive 145. The substrate 130 is positioned on processing block 125 and secured thereto. If the processing block 125 comprises a "heater block," the bond pads 155 and bonding sites 135 may be at least partially heated through conductive heat transfer from the processing block 125 while the remaining portions of the semiconductor die 140 are insulated by the layer of insulating material 160. The infrared radiation source 150 may be positioned over a region comprising at least one bond pad 155 and/or bonding site 135 and infrared radiation may be directed generally onto that region to heat the at least one bond pad 155 and/or bonding site 135 to an adequate or desired wire bond operating temperature while at the same time keeping the rest of the semiconductor die 140 from being substantially heated, as shown in FIG. 2A. With the bond pads 155 and bonding sites 135 heated to the appropriate wire bond operating temperature, the capillary 110 is positioned over bond pad 155 to attach wire 120 thereto, as illustrated in FIG. 2B. The capillary 110 is moved over to bonding site 135 while allowing the wire 120 to be drawn therethrough and the wire 120 is then bonded to bonding site 135 and severed, forming wire bond 165 between bond pad 155 and bonding site 135, as shown in FIG. 2C. Additional semiconductor dice 140 may be attached to form a stack of semiconductor dice 140 and the bond pads 155 of each subsequent semiconductor die 140 may be bonded as described above.

In embodiments in which the infrared radiation source 150 is configured to move separately from the capillary 110, the infrared radiation source 150 may continue to heat other bond pads 155 and/or bonding sites 135 ahead of the capillary 110 while the capillary 110 is forming wire bonds 165 between previously heated bond pads 155 and/or bonding sites 135. The capillary 110, therefore, is not required to stop to allow the bond pads 155 and/or bonding sites 135 to be heated, as described above. Similarly, in embodiments in which the infrared radiation source 150 heats a region comprising a plurality of bond pads 155 and/or bonding sites 135, the capillary 110 may form wire bonds 165 between each of the plurality of heated bond pads 155 and/or bonding sites 135 without the need for stopping to allow the bond pads 155 and/or bonding sites 135 to be heated. In such embodiments, after one region of bond pads 155 and/or bonding sites 135 is heated to the appropriate bonding temperature, the infrared radiation source 150 may emit infrared radiation on another region of bond pads 155 and/or bonding sites 135 while the capillary 110 is forming wire bonds 165 between bond pads 155 and/or bonding sites 135 of the heated region.

FIGS. 3A-3D show a side view of a wire bonding apparatus 200 according to another embodiment of the present invention. The wire bonding apparatus 200, like wire bonding apparatus 100, comprises a conventional bonding apparatus including a conventional bond head assembly 105 with a capillary 110 coupled to an ultrasonic transducer 115. In the embodiment illustrated, the substrate 130 is positioned on processing block 125 and includes a stack of semiconductor dice 140 attached thereto using adhesive 145. Although a stack of semiconductor dice 140 are shown, it will be apparent to one of ordinary skill in the art that this embodiment may also be used for a single semiconductor die 14. In some embodiments, the processing block 125 may not be heated and the processing block 125 may comprise a material capable of withstanding temperatures of at least 250° C. By way of example and not limitation, the processing block 125 may comprise a heat resistant plastic or polytetrafluoroethylene.

An infrared radiation source 150 is provided to heat bond pads 155 and bonding sites 135 generally from above. The infrared radiation source 150 may be mounted or attached to the bond head assembly 105 as described above with reference to FIGS. 2A-2C, or the infrared radiation source 150 may be positioned generally above the processing block 125. FIGS. 3A-3D illustrate an embodiment in which one or more infrared radiation sources 150 are positioned generally over the processing block 125 including semiconductor die or dice 140 so that each infrared radiation source 150 is directed generally over a selected region of the semiconductor die 140 and the substrate 130 and powered prior to wire bonding in that region to prevent undesirable heating of an entire semiconductor die 140.

A mask 170 may be positioned between the infrared radiation source 150 and the semiconductor die 140 in order to limit exposure of the infrared radiation substantially to those regions comprising the bond pads 155 and bonding sites 135. The mask 170 may comprise apertures 175 generally configured and positioned with relation to each bond pad 155 of a semiconductor die 140 and bonding site 135 of the substrate 130 to allow infrared radiation to pass through the apertures 175 onto the region comprising the associated bond pad 155 and/or bonding site 135. In some embodiments, each aperture 175 may be sized and positioned to allow infrared radiation to pass onto the region comprising only a single bond pad 155 or bonding site 135. In other embodiments, at least some of the apertures 175 may be sized and/or positioned to allow infrared radiation to pass onto a region comprising two or more bond pads 155 or bonding sites 135 or a combination of bond pads 155 and bonding sites 135. By way of example and not limitation, the apertures 175 may be sized and/or positioned to allow the infrared radiation to pass onto a region comprising approximately half the total number of the bond pads 155 and/or bonding sites 135 on one side of semiconductor die 140. The total area may depend on the size of the semiconductor die 140. For example, in some embodiments the total area comprising two or more bond pads 155 and/or bonding sites 135 may comprise less than 15 square millimeters. In some non-limiting embodiments, the total region may comprise an area approximately between 10 square millimeters and 2 square millimeters.

In order to block unwanted infrared radiation from passing through the mask 170 at areas in which there are no apertures 175, the mask 170 may comprise a thermally insulative and/or reflective material capable of blocking the infrared radiation waves emitted by the infrared radiation source 150. The mask 170 may comprise a rigid core with a thermal insulative material positioned over a surface facing the infrared radiation source 150. By way of example and not limitation, the rigid core may comprise a PCB-type material, such as FR4 in which the apertures 175 may be formed by micro-drilling or etching. By way of further example and not limitation, the thermal insulative material positioned between the rigid core and the infrared radiation source 150 may comprise a thermal insulation tape such as an aluminized polyimide tape. A non-limiting example of a suitable thermal insulation tape is sold as PB216B aluminized polyimide tape from Sheldahl, located in Northfield, Minn. In some embodiments, a lens or lenses 185 may be employed in combination with the mask 170 to focus the infrared radiation passing through apertures 175 onto the region comprising, for example, an associated bond pad 155 and bonding site 135.

Figure 3A:
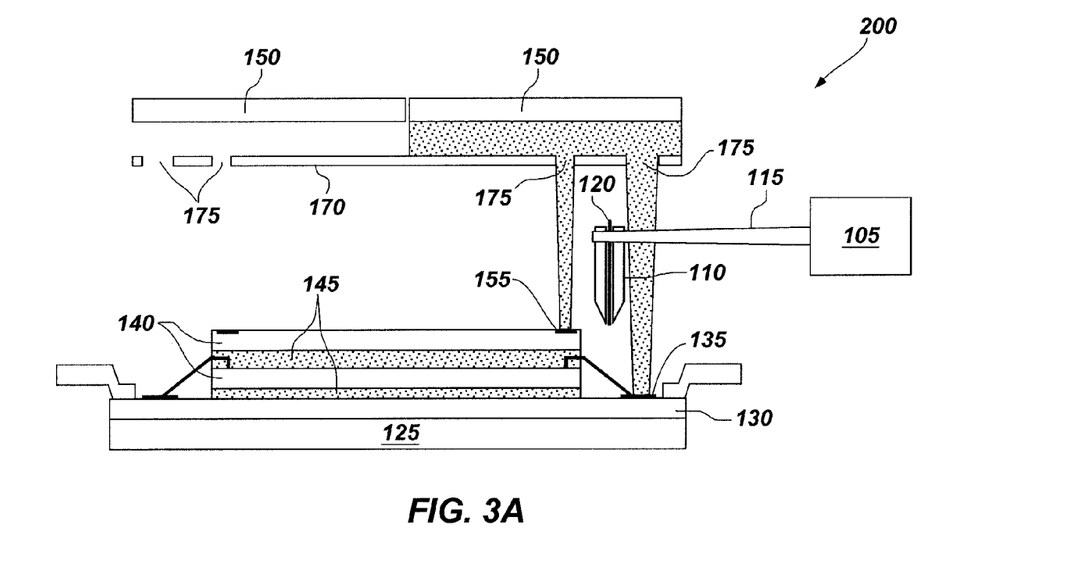
FIG. 3A shows a side view of a wire bonding apparatus according to another embodiment of the present invention illustrating an infrared radiation being emitted to heat a bond pad on a semiconductor die.
Figure 3B:
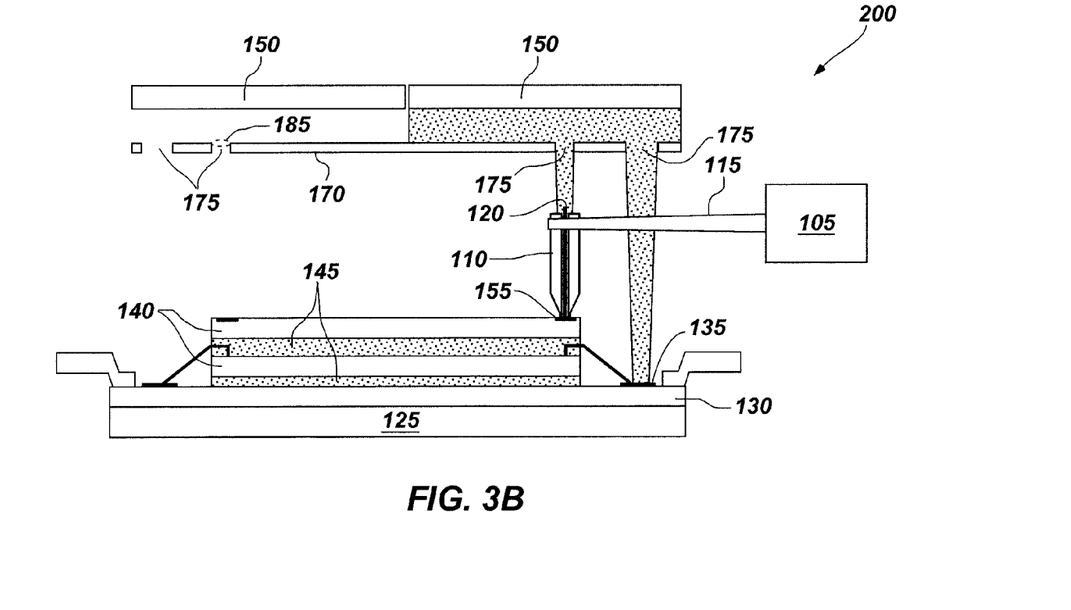
FIG. 3B shows a side view of the wire bonding apparatus of FIG. 3A illustrating a wire being bonded to a bond pad on a surface of a semiconductor die.
Figure 3C:
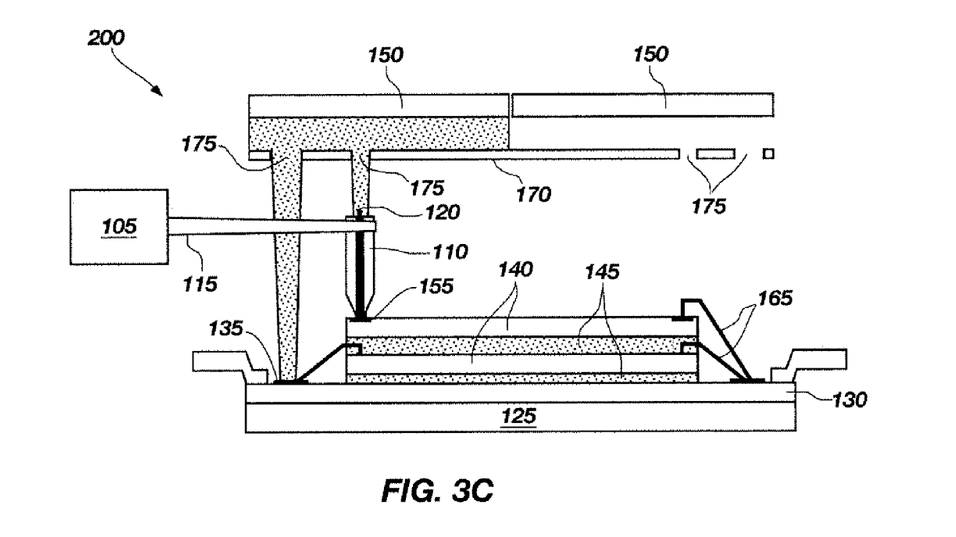
FIG. 3C shows a side view of the wire bonding apparatus of FIG. 3A illustrating a completed wire bond between the bond pad and a bonding site on the surface of the substrate and another wire being bonded to another bond pad on the surface of the semiconductor die that has been heated by the infrared radiation.
Figure 3D:
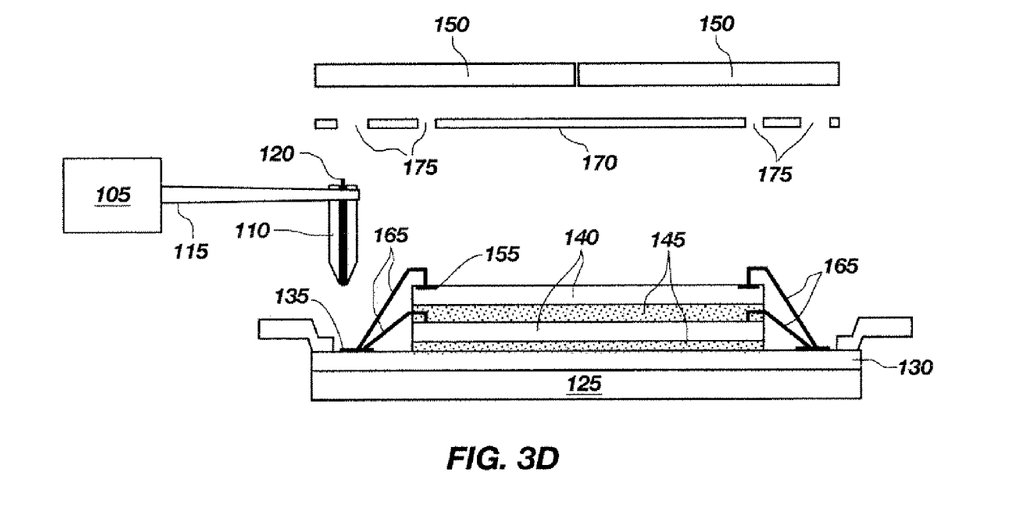
FIG. 3D shows a side view of the wire bonding apparatus of FIG. 3A illustrating another completed wire bond between the other bond pad and another bonding site on the surface of the substrate.

In one embodiment, a wire bond 165 may be formed by positioning a substrate 130 having a semiconductor die 140 adhered thereto with an adhesive 145 on a processing block. Infrared radiation may be focused onto one or more bond pads 155 and bonding sites 135 by passing the infrared radiation through apertures 175 in mask 170 to heat up the one or more bond pads 155 and bonding sites 135 to the wire bond operating temperature, as illustrated in FIG. 3A. With the one or more bond pads 155 and bonding sites 135 heated to the appropriate wire bonding operating temperature, the capillary 110 may be positioned over a bond pad 155 to position and mechanically and electrically connect wire 120 on bond pad 155, as illustrated in FIG. 3B. The capillary 110 is then moved away from bond pad 155 over to a bonding site 135 while allowing the wire 120 to be drawn therethrough to form a loop, and the wire 120 is then bonded or electrically connected to bonding site 135, forming wire bond 165 between bond pad 155 and bonding site 135, as shown in FIG. 3C. Another infrared radiation source 150 may emit an infrared radiation through other apertures 175 in mask 170 to heat up one or more other bond pads 155 and bonding sites 135. Capillary 110 may position wire 120 in contact with the other bond pad 155 to mechanically and electrically connect wire 120 thereto. The capillary 110 is moved away from the other bond pad 155 over to the other bonding site 135 to bond or electrically connect the wire 120 to the other bonding site 135, forming another wire bond 165, as depicted in FIG. 3D. Additional semiconductor dice 140 may be adhered to the top of any preceding semiconductor die 140 using adhesive 145, and each subsequent semiconductor die 140 may have wire bonds 165 formed in a similar fashion as described above.

It will be appreciated by those of ordinary skill in the art that heating semiconductor dice 140 solely from above becomes ever-more desirable in the case of stacked semiconductor dice 140 as the number of dice in the stack increases to avoid undue heating of the semiconductor dice 140 and adhesive layers 145.

CONCLUSION

Various embodiments of the present invention are described above and directed toward embodiments of an apparatus and method for forming a wire bond without substantially heating a semiconductor die. In one embodiment, an apparatus for forming a wire bond may comprise a processing block configured to support a substrate thereon. The substrate may include at least one semiconductor die attached thereto as well as at least one bonding site. An infrared radiation source may be provided and configured to selectively emit infrared radiation on a bond pad of the semiconductor die and the bonding site of the substrate to heat the bond pad and the bonding site to a predetermined temperature. The apparatus may include a bond head assembly comprising an attached capillary configured to form a wire bond between the bond pad of the semiconductor device and the bonding site of the substrate. A partially insulated, heated processing block may be employed to selectively heat portions of the semiconductor die and substrate from beneath.

An embodiment of a method of wire bonding a semiconductor die to a substrate is also provided. The method comprises positioning a substrate on a processing block, the substrate including at least one bonding site. At least one semiconductor die may be attached to the substrate, the at least one semiconductor die comprising at least one bond pad. Infrared radiation may be applied in a controlled manner and optionally focused on the at least one bond pad to heat the bond pad to a wire bond operating temperature. A wire may be bonded to the at least one bond pad and to the at least one bonding site. Selective heating of portions of the semiconductor die and substrate may also be effected, or all heating of the bond pads and bonding sites may be effected in a controlled, selective manner from above While certain embodiments have been described and shown in the accompanying drawings, such embodiments are merely illustrative and not restrictive of the scope of the invention, and this invention is not limited to the specific constructions and arrangements shown and described, since various other additions and modifications to, and deletions from, the described embodiments will be apparent to one of ordinary skill in the art. Thus, the scope of the invention is only limited by the literal language, and equivalents, of the claims which follow.

What is claimed is:

1. An apparatus for forming wire bonds, comprising:
a processing block;
a capillary attached to a bond head assembly; and
at least one infrared radiation source mounted to the bond head assembly and positionable above the processing block, the at least one infrared radiation source configured and oriented to simultaneously emit radiation limited to at least one selected location on the processing block, comprising an area substantially equivalent to an area occupied by two or more bond pads of a semiconductor die disposed on the processing block.

2. An apparatus for forming wire bonds, comprising:
a processing block;
a capillary attached to a bond head assembly; and
at least one infrared radiation source positionable above the processing block configured and oriented to simultaneously emit radiation limited to at least one selected location on the processing block, comprising an area of two or more bond pads of a semiconductor die disposed on the processing block, wherein the processing block comprises a heater block comprising a layer of thermal insulating material positioned to lie below an area of a carrier substrate bearing at least one semiconductor die and disposed on the heater block during formation of the wire bonds.

3. The apparatus of claim 1, wherein the at least one selected location comprises half of the bond pads on a single side of the semiconductor die.

4. The apparatus of claim 1, wherein the at least one infrared radiation source is configured to be positioned over the processing block independently of the capillary.

5. The apparatus of claim 1, wherein the at least one infrared radiation source comprises a lens to focus the infrared radiation to the at least one selected location.

6. The apparatus of claim 1, wherein the at least one infrared radiation source is positioned generally above the processing block, and further comprising a mask positioned between the at least one infrared radiation source and the processing block, the mask comprising at least one aperture.

7. The apparatus of claim 6, further comprising at least one lens positioned to focus the infrared radiation passing through the at least one aperture.

8. The apparatus of claim 1, wherein the at least one infrared radiation source comprises a plurality of radiation sources located over different regions of the processing block.

9. An apparatus for forming wire bonds, comprising:
a processing block;
a capillary attached to a bond head assembly; and
at least one infrared radiation source mounted to the bond head assembly, positionable above the processing block and configured for emitting radiation limited to at least one selected location on the processing block, the at least one selected location comprising an area sized and shaped substantially equivalent to an area occupied by at least one bonding site of a carrier substrate disposed on the processing block and at least one associated bond pad of a semiconductor die positioned on the carrier substrate between which at least one bonding site and at least one associated bond pad a wire bond is to be extended.

10. The apparatus of claim 9, wherein the process block comprises a heated processing block comprising a layer of thermal insulating material positioned to lie below a central area of the carrier substrate disposed on the processing block.

11. The apparatus of claim 9, wherein the at least one infrared radiation source is positionable over the processing block independently of the capillary.

12. The apparatus of claim 9, wherein the at least one infrared radiation source is positioned generally above the processing block and further comprising a mask positioned between the at least one infrared radiation source and the processing block, the mask comprising at least one aperture for allowing infrared radiation to pass onto the at least one selected location on the processing block.

13. An apparatus for forming wire bonds, comprising:
a heater block comprising a layer of thermal insulating heat resistant plastic material positioned to lie below an area of a carrier substrate bearing at least one semiconductor die and disposed on the heater block for a wire bonding operation;
at least one infrared radiation source configured to emit radiation toward an area of at least one selected location on the heater block;
a wire bond capillary attached to a bond head assembly.

14. The apparatus of claim 13, wherein the infrared radiation source is mounted to the bond head assembly.

15. The apparatus of claim 13, wherein the area of at least one selected location comprises an area substantially equivalent to one of:
two or more bond pads of the semiconductor die; and
at least one bond pad and at least one bonding site of the substrate.

16. The apparatus of claim 13, wherein the infrared radiation source is positioned generally above the heater block and further comprising a mask positioned between the infrared radiation source and the heater block, the mask comprising at least one aperture to allow the infrared radiation to pass therethrough toward the at least one selected location.

17. The apparatus of claim 16, further comprising a lens configured, in combination with the at least one mask aperture, to focus infrared radiation onto the at least one selected location.

18. A method of wire bonding a semiconductor die, comprising:
positioning a substrate comprising at least one bonding site on a processing block;
adhering at least one semiconductor die comprising a plurality of bond pads on the substrate;

heating a region directly below at least one bonding site of the substrate and the plurality of bond pads of the at least one semiconductor die with the processing block while preventing heat conduction from the processor block under another region of the substrate using a layer of thermal insulating heat resistant plastic material positioned under the substrate;

focusing infrared radiation on a selected region comprising one of:
  two or more bond pads of the plurality of bond pads; and
  at least one bond pad of the plurality of bond pads and at least one bonding site; and forming at least one wire bond between a bond pad and a bonding site.

19. The method of claim 18, wherein focusing the infrared radiation on a region comprises emitting the infrared radiation from an infrared radiation source controllably mounted to a bond head assembly.

20. The method of claim 18, wherein focusing the infrared radiation on the selected region comprises emitting the infrared radiation through at least one aperture in a mask.

21. The method of claim 18, wherein focusing the infrared radiation on the selected region comprises focusing the infrared radiation on the selected region comprising half of the bond pads on a single side of the semiconductor die.

22. The method of claim 18, wherein adhering the at least one semiconductor die on the substrate comprises attaching a first semiconductor die on the substrate and adhering at least one other semiconductor die on the first semiconductor die.

23. The method of claim 18, further comprising focusing the infrared radiation on another selected region substantially simultaneous to forming the at least one wire bond.

24. A method of wire bonding, comprising:
positioning at least one semiconductor die comprising at least one bond pad on a substrate comprising at least one bonding site;
positioning the substrate on a heater block comprising an insulation heat resistant plastic layer positioned between a portion of the heater block and the substrate and conductively heating the substrate at a region directly below at least one of the at least one bond pad and the at least one bonding site while impeding heat transfer with the insulation layer to an area of the substrate over the insulation layer;
focusing infrared radiation on the at least one bond pad to heat the at least one bond pad without substantially heating a remaining portion of the at least one semiconductor die; and
bonding a wire to the at least one bond pad.

* * * * *